(12) United States Patent
Fukui et al.

(10) Patent No.: US 11,992,882 B2
(45) Date of Patent: May 28, 2024

(54) CUTTING TOOL

(71) Applicants: Sumitomo Electric Hardmetal Corp., Itami (JP); Sumitomo Electric Industries, Ltd., Osaka (JP)

(72) Inventors: Haruyo Fukui, Itami (JP); Daiji Tabayashi, Itami (JP); Yoshihiro Saito, Osaka (JP); Kazuya Tokuda, Osaka (JP); Yoshiharu Utsumi, Kyoto (JP); Hajime Takamatsu, Kyoto (JP)

(73) Assignees: SUMITOMO ELECTRIC HARDMETAL CORP., Itami (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 98 days.

(21) Appl. No.: 17/793,036

(22) PCT Filed: Apr. 24, 2020

(86) PCT No.: PCT/JP2020/017712
§ 371 (c)(1),
(2) Date: Jul. 15, 2022

(87) PCT Pub. No.: WO2021/214983
PCT Pub. Date: Oct. 28, 2021

(65) Prior Publication Data
US 2023/0150035 A1    May 18, 2023

(51) Int. Cl.
*B32B 9/00*  (2006.01)
*B23B 27/14*  (2006.01)
(Continued)

(52) U.S. Cl.
CPC .............. *B23B 27/14* (2013.01); *C22C 29/08* (2013.01); *C23C 14/0605* (2013.01);
(Continued)

(58) Field of Classification Search
CPC . Y10T 428/30; C23C 30/005; C23C 14/0605; B23B 2226/125; B23B 2228/105
(Continued)

(56) References Cited

U.S. PATENT DOCUMENTS

2003/0049083 A1    3/2003 Ohtani et al.
2018/0147635 A1    5/2018 Mori et al.
(Continued)

FOREIGN PATENT DOCUMENTS

CN    107486579 A    12/2017
CN    108203090 A     6/2018
(Continued)

OTHER PUBLICATIONS

Extended European Search Report issued Mar. 27, 2023 in European Patent Application No. 20932374.0, 11 pages.
(Continued)

*Primary Examiner* — Daniel H Miller
(74) *Attorney, Agent, or Firm* — XSENSUS LLP

(57) ABSTRACT

Provided is a cutting tool that can have a long tool life even when used to cut soft metals in particular. The cutting tool comprises a base body and a hard carbon film arranged on the base body, the hard carbon film includes an amorphous phase and a graphite phase, the density of the hard carbon film is no less than 2.5 g/cm³ and no more than 3.5 g/cm³, the degree of crystallinity of the hard carbon film is no more than 6.5%, and the average coordination number of the amorphous phase is no less than 2.5 and no more than 4.

15 Claims, 9 Drawing Sheets

(51) Int. Cl.
 C22C 29/08 (2006.01)
 C23C 14/06 (2006.01)
 C23C 30/00 (2006.01)
(52) U.S. Cl.
 CPC ...... *C23C 30/005* (2013.01); *B23B 2226/125* (2013.01); *B23B 2228/105* (2013.01); *Y10T 428/30* (2015.01)
(58) Field of Classification Search
 USPC .......................................................... 428/408
 See application file for complete search history.

(56) References Cited

U.S. PATENT DOCUMENTS

| | | | |
|---|---|---|---|
| 2018/0180182 A1 | 6/2018 | Ozaki et al. | |
| 2019/0100434 A1 | 4/2019 | Moriguchi et al. | |

FOREIGN PATENT DOCUMENTS

| | | | |
|---|---|---|---|
| EP | 1266879 | A2 | 12/2002 |
| JP | 2003-62705 | A | 3/2003 |
| JP | 2003-62706 | A | 3/2003 |
| JP | 2005-022073 | A | 1/2005 |
| JP | 2009-6470 | A | 1/2009 |
| JP | 2009-220238 | A | 10/2009 |
| JP | 2009-241252 | A | 10/2009 |
| JP | 2010-156026 | A | 7/2010 |
| JP | 2017-171988 | A | 9/2017 |
| SG | 11201700614 | | 3/2017 |
| WO | 2016/017375 | A | 2/2016 |
| WO | 2016/190443 | A1 | 12/2016 |
| WO | 2017/022659 | A1 | 2/2017 |

OTHER PUBLICATIONS

Ming-Sheng Leu, et al., "Diamond-like coatings prepared by the filtered cathodic arc technique for minting application", Surface and Coatings Technology, Jan. 1, 2004, 7 pages, XP093032584.
G. A. J. Amaratunga, et al., "Electronic Properties of Tetrahedral Amorphous Carbon (TA-C) Films Containing Nanotube Regions", Carbon, vol. 36, No. 5-6, Jan. 1, 1998, 5 pages, XP004124230.
U.S. Appl. No. 17/793,056, filed Jul. 15, 2022, 49 pages.
U.S. Appl. No. 17/802,536, filed Aug. 26, 2022, 40 pages.
Notice of Allowance mailed Mar. 28, 2024 in related U.S. Appl. No. 17/793,056.

CUTTING TOOL

The present application is based on PCT filing PCT/JP2020/017712, filed Apr. 24, 2020, the entire contents of which are incorporated herein by reference.

TECHNICAL FIELD

The present disclosure relates to a cutting tool.

BACKGROUND ART

Hard carbon films such as amorphous carbon and diamond-like carbon are used as coating materials for cutting tools, metal molds, and machine components because of their excellent wear resistance and lubricity.

Japanese Patent Laying-Open No. 2003-62706 (Patent Literature 1) discloses an amorphous carbon covered tool comprising a base body composed of WC base and an amorphous carbon film that covers the base body.

WO 2016/190443 (Patent Literature 2) discloses a cutting tool equipped with a base body and a DLC layer positioned on the surface of the base body and containing diamond-like carbon.

CITATION LIST

Patent Literature

PTL 1: Japanese Patent Laying-Open No. 2003-62706
PTL 2: WO 2016/190443

SUMMARY OF INVENTION

A cutting tool of the present disclosure is
a cutting tool comprising a base body and a hard carbon film arranged on the base body, in which
the hard carbon film includes an amorphous phase and a graphite phase,
the density of the hard carbon film is no less than 2.5 $g/cm^3$ and no more than 3.5 $g/cm^3$,
the degree of crystallinity of the hard carbon film is no more than 6.5%, and
the average coordination number of the amorphous phase is no less than 2.5 and no more than 4.

DETAILED DESCRIPTION

Figure 1:
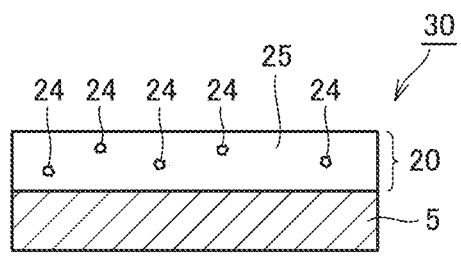
FIG. 1 is a cross-sectional view of an example of a cutting tool according to one embodiment of the present disclosure.

Problem to be Solved by the Present Disclosure

In recent years, the diversity of work materials has advanced, and processing of soft metals such as aluminum alloys, non-ferrous metals such as titanium, magnesium, and copper, organic materials, materials containing hard particles such as graphite, and carbon fiber reinforced plastics (CFRPs) has been carried out.

When cutting the above materials using a cutting tool having a hard carbon film, the work material tends to adhere to the cutting edge portion of the tool, causing increased cutting resistance, edge defects, and a decreased tool life. This is especially likely to occur when the work material is a soft metal. Accordingly, there is a need for a cutting tool that can have a long tool life even when used to cut soft metals.

Therefore, an object of the present disclosure is to provide a cutting tool that can have a long tool life even when used to cut soft metals in particular.

Advantageous Effect of the Present Disclosure

According to the present disclosure, it is possible to provide a cutting tool that can have a long tool life even when used to cut soft metals in particular.

Description of Embodiments

At first, implementations of the present disclosure are enumerated and described.

(1) A cutting tool of the present disclosure is
a cutting tool comprising a base body and a hard carbon film arranged on the base body, in which
the hard carbon film includes an amorphous phase and a graphite phase,
the density of the hard carbon film is no less than 2.5 $g/cm^3$ and no more than 3.5 $g/cm^3$, the degree of crystallinity of the hard carbon film is no more than 6.5%, and the average coordination number of the amorphous phase is no less than 2.5 and no more than 4.

The cutting tool of the present disclosure can have a long tool life even when used to cut soft metals in particular.

(2) The hard carbon film preferably has a thickness of no less than 0.1 μm and no more than 3 μm at a portion involved in cutting. According to this, exfoliations or defects of the hard carbon film can be suppressed.

(3) The hard carbon film preferably has a hydrogen content of no more than 5 atom %. According to this, the hardness and oxidation resistance of the hard carbon film are improved.

(4) The base body and the hard carbon film are preferably in contact with each other. According to this, the adhesiveness between the base body and the hard carbon film is improved.

(5) The cutting tool preferably comprises an interface layer disposed between the base body and the hard carbon film, wherein the interface layer contains:
at least one selected from the group consisting of a material made of a single element selected from a first group consisting of Group 4 elements, Group 5 elements, Group 6 elements, Group 13 elements, and Group 14 elements excluding carbon in the Periodic Table, an alloy or first compound containing at least one element selected from the first group, and a solid solution derived from the first compound; or
one or both of a second compound composed of at least one element selected from the first group and carbon, and a solid solution derived from the second compound, and the interface layer has a thickness of no less than 0.5 nm and less than 10 nm.

According to this, the base body and the hard carbon film are firmly adhered to each other via the interface layer, and the interface layer acts to balance the difference in hardness between the base body and the hard carbon film, in other words, it acts as a buffer, which improves impact resistance as well.

(6) The base body is preferably composed of WC-based cemented carbide or cermet. According to this, the cutting tool is suited for cutting non-ferrous alloys, especially aluminum alloys, copper alloys, magnesium alloys, and others.

(7) The base body is preferably composed of cubic boron nitride. According to this, the cutting tool is suited for cutting non-ferrous alloys, especially aluminum alloys, copper alloys, magnesium alloys, and others.

Details of Embodiments of the Present Disclosure

Hereinafter, a specific example of the cutting tool of the present disclosure will be described with reference to drawings. In the drawings of the present disclosure, the same reference signs represent the same portions or equivalent portions. In addition, dimensional relationships such as length, width, thickness, and depth are changed as appropriate for clarity and simplicity in the drawings and do not necessarily represent actual dimensional relationships.

Notations in the form of "A to B" as used herein mean the upper limit and lower limit of the range (that is, no less than A and no more than B), and when no unit is given in A but only in B, the unit in A is the same as the unit in B.

Embodiment 1: Cutting Tool

Figure 2:
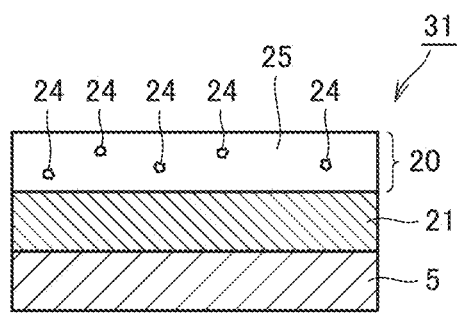
FIG. 2 is a cross-sectional view of another example of a cutting tool according to one embodiment of the present disclosure.

A cutting tool according to one embodiment of the present disclosure (hereinafter, also referred to as "the present embodiment") will be described with reference to FIGS. 1 and 2. FIG. 1 is a cross-sectional view of an example of the cutting tool according to the present embodiment. FIG. 2 is a cross-sectional view of another example of the cutting tool according to the present embodiment.

As shown in FIG. 1, a cutting tool 30 of the present embodiment comprises a base body 5 and a hard carbon film 20 arranged on base body 5, hard carbon film 20 including an amorphous phase 25 and a graphite phase 24, the density of hard carbon film 20 being no less than 2.5 g/cm$^3$ and no more than 3.5 g/cm$^3$, the degree of crystallinity of hard carbon film 20 being no more than 6.5%, and the average coordination number of amorphous phase 25 being no less than 2.5 and no more than 4.

The hard carbon film of the present embodiment can have a long tool life even when used to cut soft metals in particular. The reason for this is not clear, but may be presumed to be as in (i) to (iv) below.

(i) In the cutting tool of the present embodiment, the hard carbon film includes the amorphous phase and the graphite phase. When the graphite phase, which has a high density, is included in the amorphous phase with a low density, the graphite phase functions like a nanofiller in an organic polymeric material. That is, the graphite phase is worn moderately during cutting and reduces friction caused by the unevenness on the cutting tool surface, thereby suppressing deposition of the work material.

(ii) In the cutting tool of the present embodiment, the density of the hard carbon film is no less than 2.5 g/cm$^3$ and no more than 3.5 g/cm$^3$. When the density of the hard carbon film is in this range, the hardness of the hard carbon film is moderate and the hard carbon film can have excellent wear resistance.

(iii) In the cutting tool of the present embodiment, the degree of crystallinity of the hard carbon film is no more than 6.5%. When the degree of crystallinity is no more than 6.5%, the hardness of the hard carbon film is moderate and the hard carbon film can have excellent wear resistance.

(iv) In the cutting tool of the present embodiment, the average coordination number of the amorphous phase is no less than 2.5 and no more than 4. When the average coordination number of the amorphous phase is in this range, the hardness of the hard carbon film is moderate and the hard carbon film can have excellent wear resistance. When the average coordination number of the amorphous phase is no more than 2.5, hardness is decreased and wear resistance is not obtained. Also, the carbon atom cannot take more than 4 coordinations, so the average coordination number does not exceed 4.

In FIG. 1, base body 5 and hard carbon film 20 are in contact with each other, but the cutting tool of the present embodiment is not limited to this. For example, as shown in FIG. 2, a cutting tool 31 of the present embodiment can comprise an interface layer 21 disposed between base body 5 and hard carbon film 20. It can also comprise, between base body 5 and interface layer 21, a mixed composition layer (not shown in the figure) in which the compositions of these films are mixed, or a gradient composition layer (not shown in the figure) in which the composition varies continuously. Furthermore, it can comprise an underlying layer (not shown in the figure) between base body 5 and interface layer 21 for improving the adhesiveness between them.

Hard carbon film 20 may be arranged so as to cover the entire surface of base body 5, or it may be arranged so as to cover part of it. When the hard carbon film is arranged so as to cover part of the base body, it is preferably arranged so as to cover at least the surface of a portion of the base body involved in cutting. The portion of the base body involved in cutting as used herein means a region in the base body bounded by its cutting edge ridge and a hypothetical plane at a distance of 2 mm from the cutting edge ridge to the base body side along the perpendicular line of the tangent line of the cutting edge ridge.

<Base Body>

As base body 5, metallic or ceramic base bodies can be used. Specific examples thereof include base bodies made of iron, heat-treated steel, WC-based cemented carbide, cermet, stainless steel, nickel, copper, aluminum alloys, titanium alloys, alumina, cubic boron nitride, and silicon carbide. Among them, it is preferable to use a base body composed of WC-based cemented carbide, cermet, or cubic boron nitride.

<Hard Carbon Film>

(Composition)

Hard carbon film 20 includes amorphous phase 25 and graphite phase 24. In FIG. 1, graphite phase 24 is shown in the form of granules, but the shape of the graphite phase is not particularly limited. The shape of the graphite phase may be in the form of sheets, layers of overlapping sheets, or irregular shapes. The hard carbon film can consist only of the amorphous phase and the graphite phase.

In the present specification, determination as to whether the hard carbon film includes an amorphous phase and a graphite phase is carried out by X-ray diffraction measurement. A specific confirmation method will be described below.

(A1) The hard carbon film is peeled off from the substrate and filled into a glass capillary (capillary with a diameter of 0.7 mm and a wall thickness of 0.01 mm), and X-ray diffraction measurement is carried out using high-energy synchrotron radiation such as Spring-8 under the conditions below to obtain an X-ray diffraction pattern.

X-ray source: synchrotron radiation source
X-ray energy: 35 keV
Entrance slit width: 0.2 mm
Detector: Si element one-dimensional detector
Measurement range of diffraction angle 2θ: 3 to 77°
Measurement step: 0.005°
Integration time: 15 minutes (A2) In the obtained diffraction pattern, five peaks are selected in descending order of the peak diffraction intensity (CPS) (hereinafter, also referred to as "peak intensity"). When no less than three of these peaks have diffraction angles (2θ) that match the diffraction angles (2θ) of the graphite crystal peaks, the hard carbon film is determined to have a graphite phase. This method conforms to the Hanawalt method used in X-ray diffraction analysis of general crystalline materials. The Hanawalt method is a method for analyzing the diffraction pattern using the top three peaks in terms of peak intensity magnitude.

Note that, since the hard carbon film of the present embodiment is mainly composed of the amorphous phase, the peak intensity derived from the graphite phase may be relatively weak. In this case, the peaks can be confirmed by using a differential spectrum.

(A3) When a broad peak, called a halo pattern, is observed in the obtained diffraction pattern, the hard carbon film is determined to have an amorphous phase.

Figure 3:
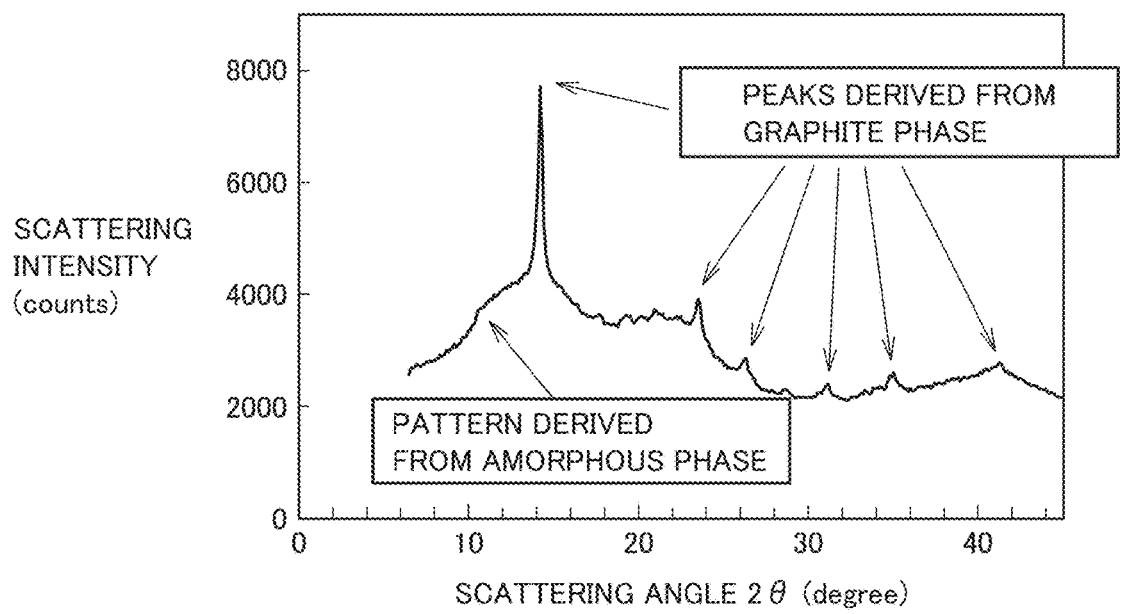
FIG. 3 is an example of the X-ray diffraction pattern of a hard carbon film of a cutting tool according to one embodiment of the present disclosure.

A specific example of the above confirmation method will be described with reference to FIG. 3. FIG. 3 is a diagram showing an example of the diffraction pattern of the hard carbon film of the present embodiment. In FIG. 3, the horizontal axis is the diffraction angle (2θ (degrees)) and the vertical axis is the scattering intensity (counts). In FIG. 3, six peaks coinciding with the diffraction angles 2θ of the graphite crystal peaks (peaks shown in FIG. 3 as "PEAKS DERIVED FROM GRAPHITE PHASE"), as well as a halo pattern (halo pattern shown in FIG. 3 as "PATTERN DERIVED FROM AMORPHOUS PHASE"), are observed.

(Density of Hard Carbon Film)

The density of hard carbon film 20 is no less than 2.5 $g/cm^3$ and no more than 3.5 $g/cm^3$. The higher the density of the hard carbon film, the higher its hardness, and the lower its density, the lower its hardness. When the density of the hard carbon film is in this range, the hardness of the hard carbon film is moderate and the hard carbon film can have excellent wear resistance.

The lower limit of the density of the hard carbon film is no less than 2.5 $g/cm^3$, preferably no less than 2.8 $g/cm^3$, and more preferably no less than 3.1 $g/cm^3$. The upper limit of the density of the hard carbon film is no more than 3.5 $g/cm^3$, and preferably no more than 3.4 $g/cm^3$. The density of the hard carbon film is preferably no less than 3.0 $g/cm^3$ and no more than 3.5 $g/cm^3$, and more preferably no less than 3.2 $g/cm^3$ and no more than 3.4 $g/cm^3$.

The density of the hard carbon film is measured by the X-ray reflectometry (measurement apparatus: "SmartLab"™ manufactured by Rigaku Corporation). The measurement conditions for the X-ray reflectometry are as follows.

Incident X-ray wavelength: 0.15406 nm (CuK ray)
Output: 45 kV, 200 mA
Measurement range (angle formed with sample surface): 0.0 to 1.0°
Measurement step: 0.001°
Note that a range with a SN as good as possible is used for the analysis.

(Degree of Crystallinity of Hard Carbon Film)

The degree of crystallinity of hard carbon film 20 is no more than 6.5%. In the present specification, the degree of crystallinity of the hard carbon film is an index that indicates the proportion of the graphite phase with respect to the amorphous phase in the hard carbon film on a volume basis. The smaller the degree of crystallinity, the lower the proportion of the graphite phase, which is of low hardness, and the higher the hardness of the hard carbon film. When the degree of crystallinity of the hard carbon film is no more than 6.5%, the hardness of the hard carbon film is moderate and the hard carbon film can have excellent wear resistance.

The upper limit of the degree of crystallinity of the hard carbon film is no more than 6.5%, preferably no more than 5.9%, and more preferably no more than 5.0%. The degree of crystallinity of the hard carbon film is preferably no less than 2% and no more than 6.5%, and still more preferably no less than 3% and no more than 5%.

In the present specification, the degree of crystallinity of the hard carbon film is measured by the method described below. The details of the measurement method will be described with reference to FIGS. 3 to 11. Note that FIG. 3 shows the X-ray diffraction pattern of an example of the hard carbon film of the present embodiment, and the shape of the X-ray diffraction pattern is not limited to this.

(B1) For the hard carbon film, X-ray diffraction measurement is carried out by the same method and conditions as the above (A1), thereby obtaining an X-ray diffraction pattern. The obtained X-ray diffraction pattern is as shown in FIG. 3.

Figure 4:
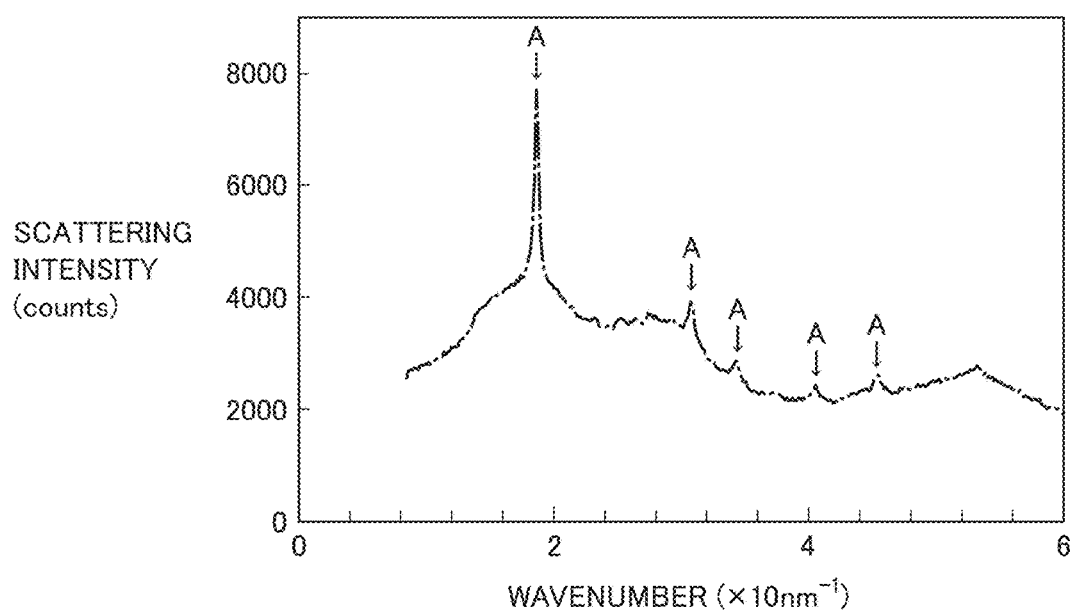
FIG. 4 is a post-transform pattern obtained by transforming the X-ray diffraction pattern shown in FIG. 3 so that the X axis indicates the wavenumber and the Y axis indicates the scattering intensity.

(B2) The obtained X-ray diffraction pattern (FIG. 3) is transformed so that the X axis indicates the wavenumber and the Y axis indicates the scattering intensity. Hereinafter, the diffraction pattern after the transform is also referred to as "post-transform pattern". The post-transform pattern is shown in FIG. 4. FIG. 4 shows the X-ray diffraction pattern shown in FIG. 3 transformed so that the X axis indicates the wavenumber and the Y axis indicates the scattering intensity.

Figure 5:
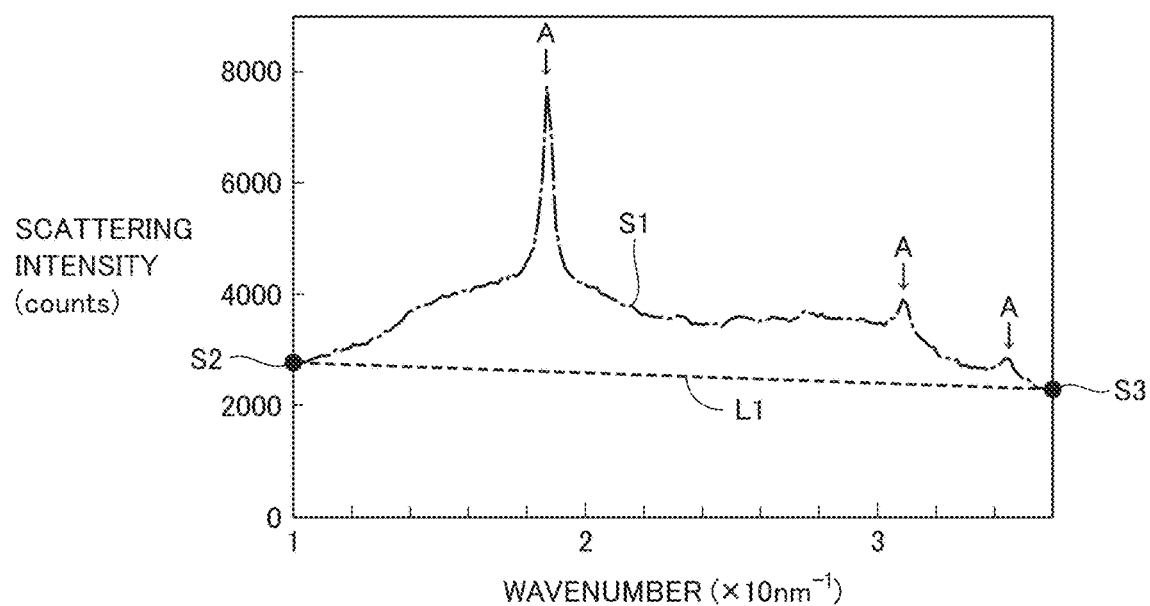
FIG. 5 is a pattern obtained by extracting the region with a wavenumber of 1 to 3.6 $Å^{-1}$ from the post-transform pattern shown in FIG. 4.

(B3) The region with a wavenumber of 1 to 3.6 $Å^{-1}$ is extracted from the post-transform pattern. The extracted post-transform pattern is shown in FIG. 5. FIG. 5 shows the region with a wavenumber of 1 to 3.6 $Å^{-1}$ extracted from the post-transform pattern shown in FIG. 4, where the X axis indicates the wavenumber and the Y axis indicates the scattering intensity.

(B4) In the extracted post-transform pattern (hereinafter, also referred to as "extracted pattern"), the points at wavenumbers of 1 $Å^{-1}$ and 3.6 $Å^{-1}$ on a spectrum S1 are connected by a straight line. In FIG. 5, the point at a wavenumber of 1 $Å^{-1}$ on spectrum S1 is represented by S2, the point at a wavenumber of 3.6 $Å^{-1}$ on spectrum S1 is represented by S3, and the line connecting S2 and S3 is represented by a dashed line L1.

Figure 6:
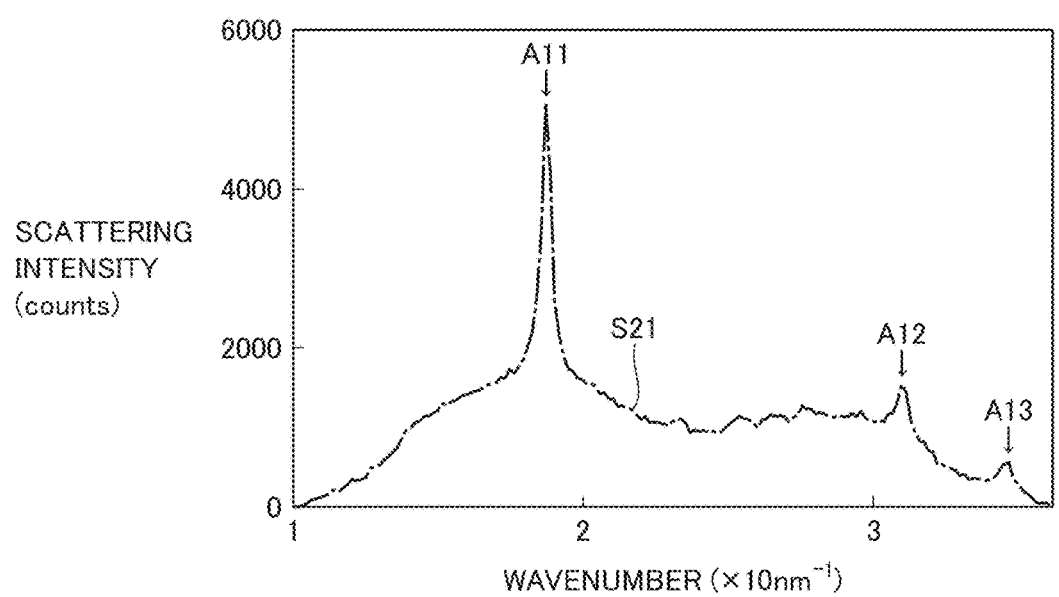
FIG. 6 is a normalized spectral pattern obtained by normalizing a spectrum S1 of the extracted pattern of FIG. 5 based on a straight line L1.

(B5) The spectrum is normalized based on the above straight line. FIG. 6 shows a pattern (hereinafter, also referred to as "normalized pattern") of a spectrum S21 (hereinafter, also referred to as "normalized spectrum"), which is obtained by normalizing spectrum S1 of the extracted pattern of FIG. 5 based on straight line L1, where the X axis indicates the wavenumber and the Y axis indicates the scattering intensity.

Figure 7:
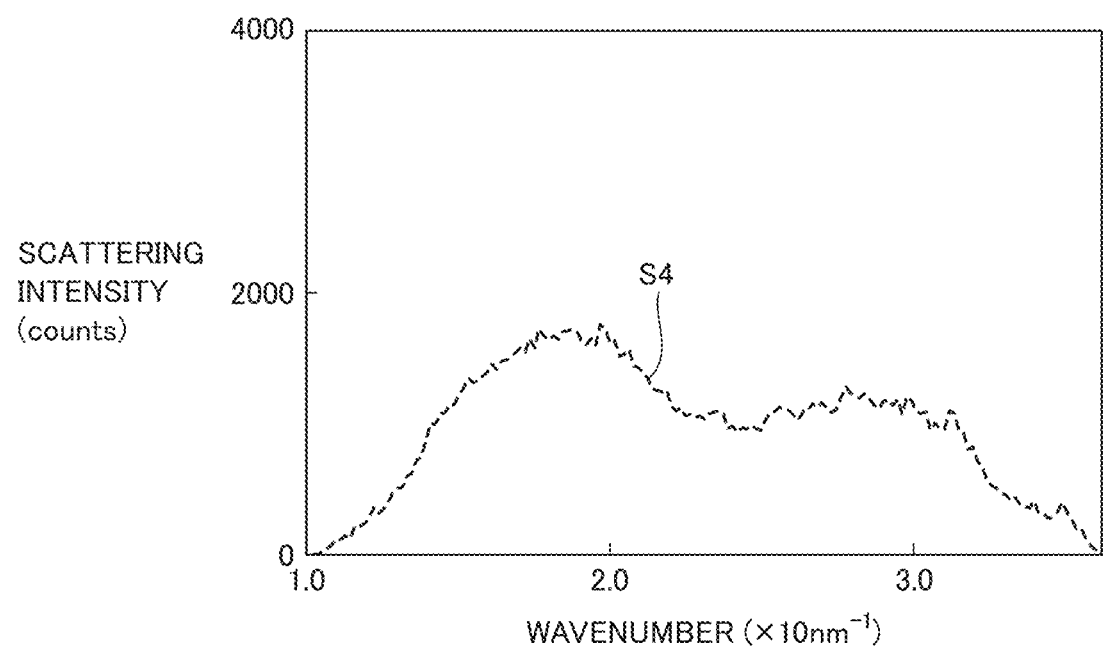
FIG. 7 is a pattern showing the spectrum derived from an amorphous phase separated from the normalized pattern of FIG. 6.
Figure 8:
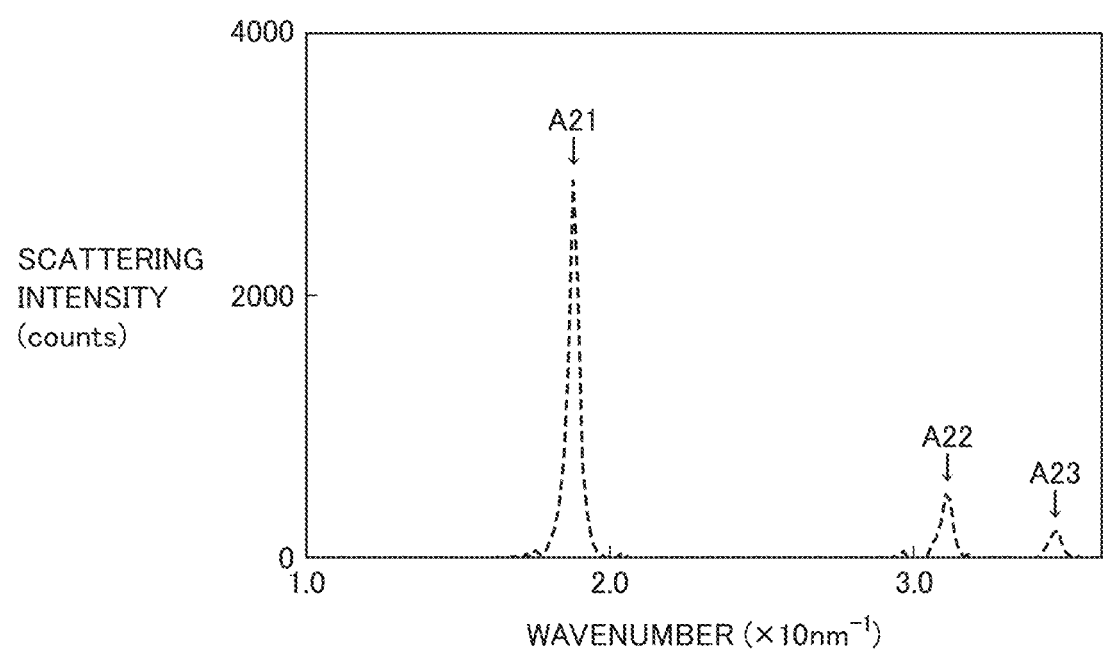
FIG. 8 is a pattern showing the peaks derived from a graphite phase separated from the normalized pattern of FIG. 6.

(B6) The normalized pattern is separated into the spectrum derived from the amorphous phase and the peaks derived from the graphite phase. FIG. 7 is a pattern showing the spectrum derived from the amorphous phase separated from the normalized pattern of FIG. 6, where the X axis indicates the wavenumber and the Y axis indicates the scattering intensity. FIG. 8 is a pattern showing the peaks derived from the graphite phase separated from the normalized pattern of FIG. 6, where the X axis indicates the wavenumber and the Y axis indicates the scattering intensity.

The specific method for separating the above normalized pattern into the spectrum derived from the amorphous phase and the peaks derived from the graphite phase will be mentioned later.

(B7) An area SA of a spectrum S4 derived from the amorphous phase shown in FIG. 7 and a total area SG of peaks A21, A22, and A23 derived from the graphite phase shown in FIG. 8 are determined. By determining the proportion of SG with respect to SA (SG/SA), the degree of crystallinity (%) is obtained. That is, the degree of crystallinity=(SG/SA)×100. The larger the value of the degree of crystallinity, the larger the proportion of the graphite phase in the hard carbon film on a volume basis.

The specific method for separating the normalized pattern into the spectrum derived from the amorphous phase and the peaks derived from the graphite phase, as described in the above (B6), is as follows.

(Method for Separating Peaks Derived from Graphite Phase)

In the normalized pattern of FIG. 6, the peaks derived from the graphite phase are identified. In FIG. 6, three peaks A11, A12, and A13 are observed. Peak A11 is a peak that exists in the wavenumber range of 1.6 to 2.1 $Å^{-1}$ and originates from the (200) plane of the graphite phase. Peak A12 is a peak that exists in the wavenumber range of 2.9 to 3.2 $Å^{-1}$ and originates from the (011) plane of the graphite phase. Peak A13 is a peak that exists in the wavenumber range of 3.3 to 3.55 $Å^{-1}$ and originates from the (012) plane of the graphite phase.

(Method for Separating Peak A11)

Figure 9:
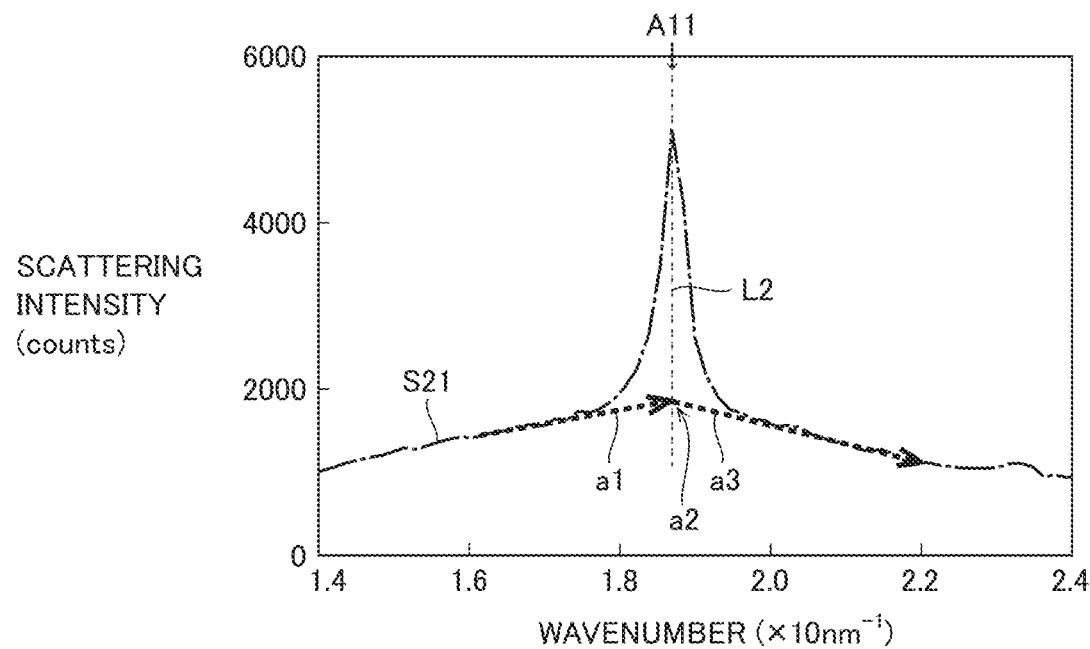
FIG. 9 shows a method for separating a peak A11 shown in FIG. 6.

The method for separating peak A11 will be described with reference to FIG. 9. FIG. 9 shows the normalized pattern shown in FIG. 6 to describe the method for separating peak A11, where the X axis indicates the wavenumber and the Y axis indicates the scattering intensity.

At first, a linear fitting is carried out on spectrum S21 in the wavenumber range of 1.6 to 1.7 $Å^{-1}$, thereby obtaining an approximate straight line a1.

Next, an intersection point a2 of a perpendicular line L2 from the peak top of peak A11 and approximate straight line a1 is determined.

Intersection point a2 and the region with a wavenumber of 2.0 to 2.1 $Å^{-1}$ on spectrum S21 are approximated by a straight line, thereby obtaining an approximate straight line a3.

By using approximate straight line a1 between a wavenumber of 1.6 $Å^{-1}$ and the wavenumber of peak A11, approximate straight line a3 between the wavenumber of peak A11 and a wavenumber of 2.1 $Å^{-1}$, and raw data for the other ranges (the ranges with wavenumbers of 1 to 1.6 $Å^{-1}$ and of 2.1 to 3 $Å^{-1}$ in FIG. 9), a line showing the spectrum derived from the amorphous phase is fabricated.

By subtracting the above line showing the spectrum derived from the amorphous phase from the spectrum shown in FIG. 6, peak A21 derived from the graphite phase, shown in FIG. 8, can be obtained.

(Method for Separating Peak A12)

Figure 10:
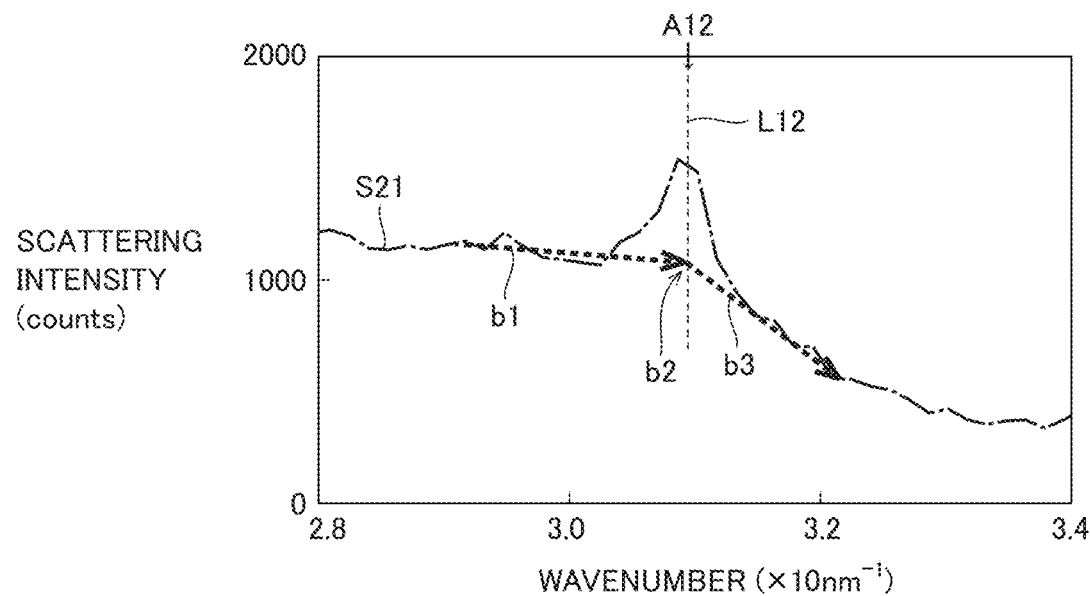
FIG. 10 shows a method for separating a peak A12 shown in FIG. 6.

The method for separating peak A12 will be described with reference to FIG. 10. FIG. 10 shows the normalized pattern shown in FIG. 6 to describe the method for separating peak A12, where the X axis indicates the wavenumber and the Y axis indicates the scattering intensity.

At first, a linear fitting is carried out on spectrum S21 in the wavenumber range of 2.9 to 3.0 $Å^{-1}$, thereby obtaining an approximate straight line b1.

Next, an intersection point b2 of a perpendicular line L12 from the peak top of A12 and approximate straight line b1 is determined.

Intersection point b2 and the region with a wavenumber of 3.15 to 3.2 $Å^{-1}$ on spectrum S21 are approximated by a straight line, thereby obtaining an approximate straight line b3.

By using approximate straight line b1 between a wavenumber of 2.9 $Å^{-1}$ and the wavenumber of peak A12, approximate straight line b3 between the wavenumber of peak A12 and a wavenumber of 3.2 $Å^{-1}$, and raw data for the other ranges (the ranges with wavenumbers of 2.5 to 2.9 $Å^{-1}$ and of 3.2 to 3.5 $Å^{-1}$ in FIG. 10), a line showing the spectrum derived from the amorphous phase is fabricated.

By subtracting the above line showing the spectrum derived from the amorphous phase from the spectrum shown in FIG. 6, peak A22 derived from the graphite phase, shown in FIG. 8, can be obtained.

(Method for Separating Peak A13)

Figure 11:
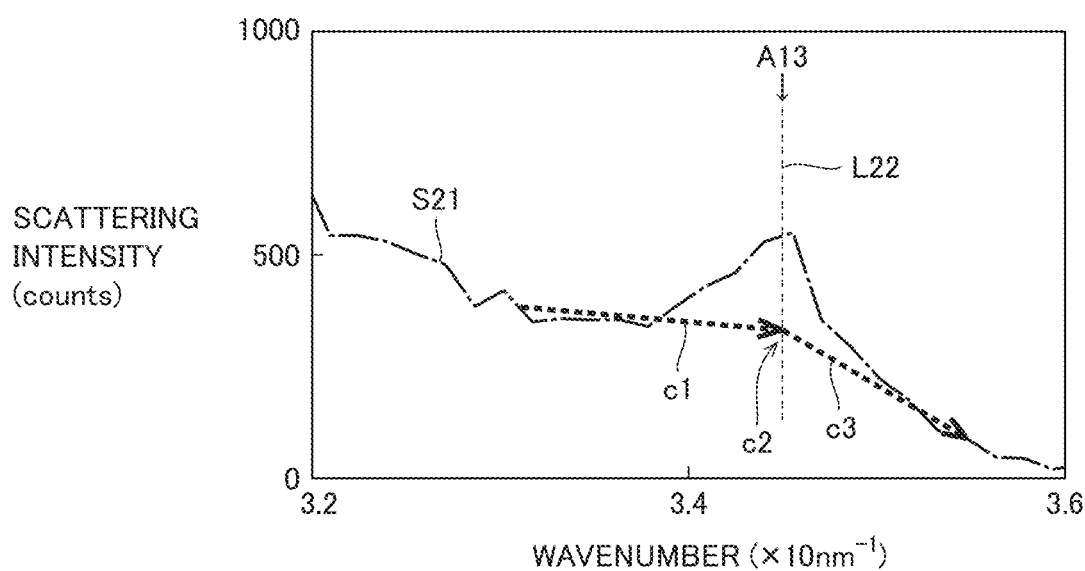
FIG. 11 shows a method for separating a peak A13 shown in FIG. 6.

The method for separating peak A13 will be described with reference to FIG. 11. FIG. 11 shows the normalized pattern shown in FIG. 6 to describe the method for separating peak A13, where the X axis indicates the wavenumber and the Y axis indicates the scattering intensity.

At first, a linear fitting is carried out on spectrum S1 in the wavenumber range of 3.3 to 3.4 Å$^{-1}$, thereby obtaining an approximate straight line c1.

Next, an intersection point c2 of a perpendicular line L22 from the peak top of peak A13 and approximate straight line c1 is determined.

Intersection point c2 and the region with a wavenumber of 3.5 to 3.55 Å$^{-1}$ on spectrum S21 are approximated by a straight line, thereby obtaining an approximate straight line c3.

By using approximate straight line c1 between a wavenumber of 3.3 Å$^{-1}$ and the wavenumber of peak A13, approximate straight line c3 between the wavenumber of peak A13 and a wavenumber of 3.55 Å$^{-1}$, and raw data for the other ranges (the ranges with wavenumbers of 3.0 to 3.3 Å$^{-1}$ and of 3.55 to 4.0 Å$^{-1}$ in FIG. 11), a line showing the spectrum derived from the amorphous phase is fabricated.

By subtracting the above line showing the spectrum derived from the amorphous phase from the spectrum shown in FIG. 6, peak A23 derived from the graphite phase, shown in FIG. 8, can be obtained.

(Method for Separating Spectrum Derived From Amorphous Phase)

By subtracting peaks A21, A22, and A23 derived from the graphite phase separated as described above from the spectrum shown in FIG. 6, the spectrum derived from the amorphous phase, shown in FIG. 7, can be obtained.

(Average Coordination Number of Amorphous Phase)

The average coordination number of amorphous phase 25 is no less than 2.5 and no more than 4. When the average coordination number of the amorphous phase is in this range, the hardness of the hard carbon film is moderate and the hard carbon film can have excellent wear resistance.

The lower limit of the average coordination number of the amorphous phase is no less than 2.5, preferably no less than 3, and more preferably no less than 3.5. The upper limit of the average coordination number of the amorphous phase is no more than 4, and the average coordination number of the amorphous phase is more preferably no less than 3.5 and no more than 4.

In the present specification, the average coordination number of the amorphous phase is calculated by the method described below. The details of the calculation method will be described with reference to FIGS. 3, 12, and 13.

(C1) For the hard carbon film, X-ray diffraction measurement is carried out by the same method and conditions as the above (A1), thereby obtaining an X-ray diffraction pattern. An example of the X-ray diffraction pattern of a hard carbon film of a cutting tool according to one embodiment of the present disclosure is shown in FIG. 3.

(C2) The total correlation function is calculated from the obtained X-ray diffraction pattern. The total correlation function is calculated by carrying out correction for background and other factors on the spectrum obtained from the X-ray diffraction measurement, followed by Fourier transform. The total correlation function can be calculated based on descriptions in, for example, [Literature 1] Shiramata et al., "PDF Analysis Using X-Ray Total Scattering—Theory and Application Examples—", Rigaku Journal, Rigaku Corporation, 2019, 50(1), p. 1-8, [Literature 2] K. Suzuya, "Structure Analysis of Liquids and Disordered Materials Using Pulsed Neutron Diffraction and Total Scattering", RADIOISOTOPES, Japan Radioisotope Association, 2011, 60, p. 63-87, and others.

Figure 12:
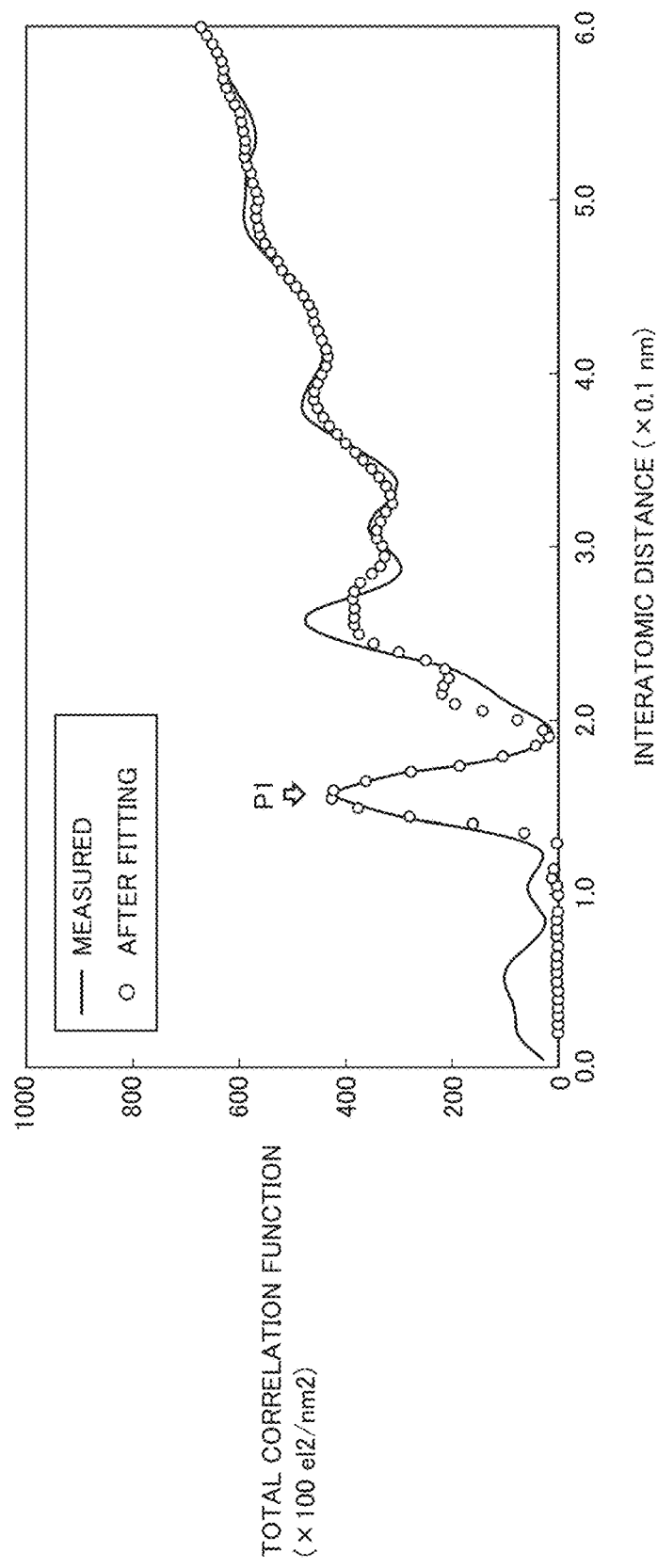
FIG. 12 shows the relationship between the measured interatomic distance calculated from the X-ray diffraction pattern of FIG. 3 and the total correlation function, as well as the relationship between the interatomic distance after fitting by the reverse Monte Carlo method and the total correlation function.

(C3) Next, in the total correlation function, the range of the distance between the nearest-neighbor carbon atom pairs (C—C) (indicated as "INTERATOMIC DISTANCE" in FIG. 12) is specified as 0.130 to 0.185 nm, and a carbon atom structure model that can reproduce the measured peak in this range is fabricated. FIG. 12 is a diagram showing the relationship between the measured interatomic distance calculated from the X-ray diffraction pattern of FIG. 3 and the total correlation function, as well as the relationship between the interatomic distance after fitting by the reverse Monte Carlo method and the total correlation function. In FIG. 12, the measured peak in the interatomic distance range of 0.130 to 0.185 nm is represented by P1.

Figure 13:
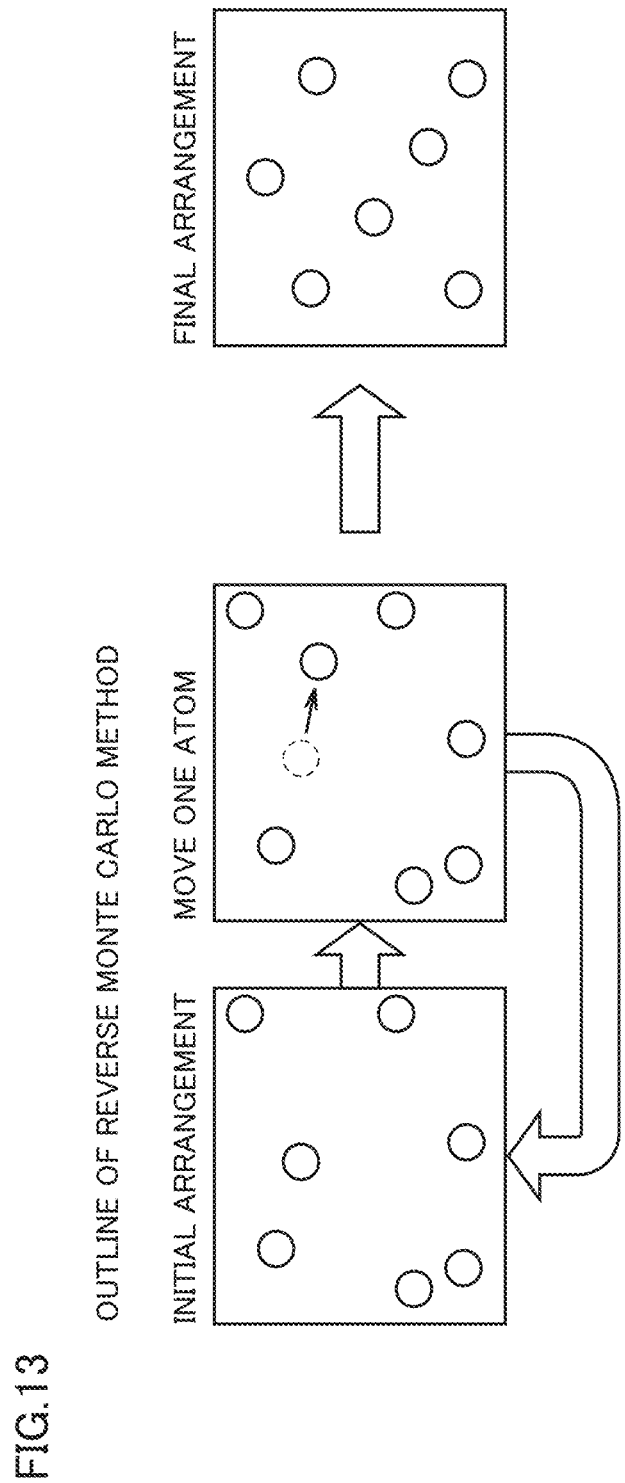
FIG. 13 is a diagram for describing the reverse Monte Carlo method.

The reverse Monte Carlo method is used to fabricate the above carbon atom structure model. FIG. 13 is a diagram for describing the reverse Monte Carlo method. As shown in FIG. 13, the reverse Monte Carlo method is a simulation method in which the atoms present in a cubic cell with the density of the target substance are moved using random numbers to determine a structure model that reproduces experimental data, such as X-ray diffraction, of the target substance. The details of the reverse Monte Carlo method will be mentioned later.

(C4) From the obtained carbon atom structure model, the average coordination number of the amorphous phase is calculated.

(Reverse Monte Carlo Method)

In the present specification, the reverse Monte Carlo method was used for the fitting of the measured total correlation function. The procedures of the reverse Monte Carlo method are described in, for example, [Literature 3] Shirakawa et al., Materia Japan, The Japan Institute of Metals and Materials, 1994, Vol. 33, No. 4, p. 400-408.

In the reverse Monte Carlo method, the total correlation function is calculated from the obtained model, and an area (S) of the difference between the total correlation function for the model and the measured total correlation function in the distance region (0.140 to 0.185 nm) is calculated. The fitting is repeated until the value of S reaches no more than 10 el$^2$/nm. In this manner, the average coordination number is calculated from the finally obtained carbon atom structure model (see the right drawing of FIG. 13).

(Thickness)

Hard carbon film 20 preferably has a thickness of no less than 0.1 μm and no more than 3 μm at a portion involved in cutting (hereinafter, also referred to as "thickness of the hard carbon film"). The portion of the hard carbon film involved in cutting as used herein means a region in the hard carbon film bounded by the cutting edge ridge of the cutting tool and a hypothetical plane at a distance of 2 mm from the cutting edge ridge to the cutting tool side along the perpendicular line of the tangent line of the cutting edge ridge. The thickness of the portion of the hard carbon film involved in cutting means the thickness of the hard carbon film in the region of the hard carbon film involved in cutting, starting from its surface in the direction along the normal line of the surface.

When the thickness of the hard carbon film is no less than 0.1 μm, wear resistance is improved. When the thickness of the hard carbon film is no more than 3 μm, an increase in the internal stress accumulated inside the hard carbon film can be suppressed, and exfoliations or defects of the hard carbon film can be suppressed.

The lower limit of the thickness of the hard carbon film is preferably no less than 0.1 μm, more preferably no less than 0.5 μm, and still more preferably no less than 1 μm. The upper limit of the thickness of the hard carbon film is preferably no more than 3 μm, more preferably no more than 2 μm, and still more preferably no more than 1.5 μm. The thickness of the hard carbon film can be no less than 0.1 μm and no more than 3 μm, no less than 0.5 μm and no more than 3 μm, no less than 1 μm and no more than 3 μm, no less than 1 μm and no more than 2 μm, or no less than 1 μm and no more than 1.5 μm.

The thickness of the hard carbon film can be measured by observing the cross section of the hard carbon film using a SEM (scanning electron microscope, measurement apparatus: "JSM-6610 series"™ manufactured by JEOL Ltd.). Specifically, the observation magnification for the cross section sample is set to 5,000 to 10,000 times, the observation area is set to 100 to 500 μm$^2$, the thickness width is measured at three arbitrarily selected locations in one field of view, and their average value is used as the "thickness". Note that, as far as the applicants performed measurements, even if the thickness measurement results were calculated multiple times by changing the selected locations in the measurement field of view, there was almost no variation in the measurement results, and it was confirmed that the arbitrary setting of the measurement field of view did not result in arbitrary results as long as the measurements were performed on the same sample.

(Hydrogen Content)

Hard carbon film 20 is basically composed of carbon and inevitable impurities, but may contain hydrogen. This hydrogen is thought to originate from residual hydrogen and moisture in the film forming apparatus that is incorporated into the hard carbon film during film formation.

Hard carbon film 20 preferably has a hydrogen content of no more than 5 atom %. According to this, the proportion of sp3 bonds in the hard carbon film is higher, resulting in higher hardness. Furthermore, the oxidation resistance of the hard carbon film is also improved. The upper limit of the hydrogen content of the hard carbon film is more preferably no more than 4 atom %, and still more preferably no more than 2 atom %. The lower limit of the hydrogen content of the hard carbon film is preferably 0 atom %, but from the viewpoint of production, it may be no less than 0 atom %, no less than 1 atom %, or no less than 2 atom %. The hydrogen content of the hard carbon film can be no less than 0 atom % and no more than 5 atom %, no less than 0 atom % and no more than 4 atom %, no less than 0 atom % and no more than 2 atom %, no less than 1 atom % and no more than 5 atom %, no less than 1 atom % and no more than 4 atom %, no less than 1 atom % and no more than 2 atom %, no less than 2 atom % and no more than 5 atom %, or no less than 2 atom % and no more than 4 atom %.

The hydrogen content of the hard carbon film can be measured using the ERDA (elastic recoil detection analysis, measurement apparatus: "HRBS500" manufactured by Kobe Steel, Ltd.). In this method, hydrogen ions colliding with He ions injected at a low angle of incidence are recoiled in the forward direction, and the energy of the recoiled hydrogen particles is analyzed to measure the amount of hydrogen. Note that, as far as the applicants performed measurements, even if the measurement results of the hydrogen content were calculated multiple times by changing the selected locations in the measurement field of view, there was almost no variation in the measurement results, and it was confirmed that the arbitrary setting of the measurement field of view did not result in arbitrary results as long as the measurements were performed on the same sample.

(Hardness)

Hard carbon film 20 preferably has a hardness of no less than 35 GPa and no more than 75 GPa. When the hardness of the hard carbon film is no less than 35 GPa, wear resistance is improved. When the hardness of the hard carbon film is no more than 75 GPa, defect resistance is improved. The lower limit of the hardness of the hard carbon film is preferably no less than 35 GPa, more preferably no less than 45 GPa, and still more preferably no less than 55 GPa. The upper limit of the hardness of the hard carbon film is preferably no more than 75 GPa, and still more preferably no more than 73 GPa. The hardness of the hard carbon film is preferably no less than 35 GPa and no more than 75 GPa, more preferably no less than 45 GPa and no more than 73 GPa, and still more preferably no less than 55 GPa and no more than 73 GPa.

The hardness of the hard carbon film can be measured by the nanoindenter method (measurement apparatus: "Nano Indenter XP"™ manufactured by MTS). Specifically, the hardness is measured at three locations on the surface of the hard carbon film, and their average value is used as the "hardness". Note that, as far as the applicants performed measurements, even if the hardness measurement results were calculated multiple times by changing the selected locations in the measurement field of view, there was almost no variation in the measurement results, and it was confirmed that the arbitrary setting of the measurement field of view did not result in arbitrary results as long as the measurements were performed on the same sample.

<Interface Layer>

As shown in FIG. 2, cutting tool 31 of the present embodiment can comprise interface layer 21 disposed between base body 5 and hard carbon film 20. According to this, the base body and the hard carbon film are firmly adhered to each other via the interface layer.

(Composition)

The composition of interface layer 5 can be as in (K1) or (K2) below.

(K1) Containing at least one selected from the group consisting of a material made of a single element selected from a first group consisting of Group 4 elements, Group 5 elements, Group 6 elements, Group 13 elements, and Group 14 elements excluding carbon in the Periodic Table, an alloy or first compound containing at least one element selected from the first group, and a solid solution derived from the first compound; or (K2) Containing one or both of a second compound composed of at least one element selected from the above first group and carbon, and a solid solution derived from the second compound.

That is, the interface layer can be in any of the following forms (k1) to (k4).

(k1) Composed of at least one selected from the group consisting of a material made of a single element selected from the first group, an alloy or first compound containing at least one element selected from the first group, and a solid solution derived from the first compound.

(k2) Containing at least one selected from the group consisting of a material made of a single element selected from the first group, an alloy or first compound containing at least one element selected from the first group, and a solid solution derived from the first compound.

(k3) Composed of one or both of a second compound composed of at least one element selected from the first group and carbon, and a solid solution derived from the second compound.

(k4) Containing one or both of a second compound composed of at least one element selected from the first group and carbon, and a solid solution derived from the second compound.

Here, Group 4 elements in the Periodic Table include, for example, titanium (Ti), zirconium (Zr), and hafnium (Hf). Group 5 elements include, for example, vanadium (V), niobium (Nb), and tantalum (Ta). Group 6 elements include, for example, chromium (Cr), molybdenum (Mo), and tungsten (W). Group 13 elements include, for example, boron (B), aluminum (Al), gallium (Ga), and indium (In). Group 14 elements excluding carbon include, for example, silicon (Si), germanium (Ge), and tin (Sn). Hereinafter, elements included in Group 4 elements, Group 5 elements, Group 6 elements, Group 13 elements, and Group 14 elements excluding carbon are also referred to as the "first elements".

Examples of the alloy containing the first elements include Ti—Zr, Ti—Hf, Ti—V, Ti—Nb, Ti—Ta, Ti—Cr, and Ti—Mo. Examples of the intermetallic compound containing the first elements include $TiCr_2$ and $Ti_3Al$.

Examples of the first compound containing the first elements include titanium boride ($TiB_2$), zirconium boride ($ZrB_2$), hafnium boride ($HfB_2$), vanadium boride ($VB_2$), niobium boride ($NbB_2$), tantalum boride ($TaB_2$), chromium boride (CrB), molybdenum boride (MoB), tungsten boride (WB), and aluminum boride ($AlB_2$).

The above solid solution derived from the first compound means a state in which no less than two of these first compounds are dissolved within the crystal structure of each other, meaning an interstitial solid solution or a substitutional solid solution.

Examples of the second compound composed of the first elements and carbon include titanium carbide (TiC), zirconium carbide (ZrC), hafnium carbide (HfC), vanadium carbide (VC), niobium carbide (NbC), tantalum carbide (TaC), chromium carbide ($Cr_3C_2$), molybdenum carbide (MoC), tungsten carbide (WC), and silicon carbide (SiC).

The above solid solution derived from the second compound means a state in which no less than two of these second compounds are dissolved within the crystal structure of each other, meaning an interstitial solid solution or a substitutional solid solution.

The total content ratio of the material made of a single element selected from the first group, the alloy or first compound containing at least one selected from the first group, and the solid solution derived from the first compound in the interface layer (hereinafter, also referred to as the "content ratio of the first compound and the like") is preferably no less than 70% by volume and no more than 100% by volume, more preferably no less than 80% by volume and no more than 100% by volume, still more preferably no less than 90% by volume and no more than 100% by volume, and most preferably 100% by volume.

The total content ratio of the second compound and the solid solution derived from the second compound in the interface layer (hereinafter, also referred to as the "content ratio of the second compound and the like") is preferably no less than 70% by volume and no more than 100% by volume, more preferably no less than 80% by volume and no more than 100% by volume, still more preferably no less than 90% by volume and no more than 100% by volume, and most preferably 100% by volume.

The composition of the interface layer, the content ratio of the first compound and the like, and the content ratio of the second compound and the like can be measured by the transmission electron microscopy-energy dispersive X-ray spectrometry (TEM-EDX) method. Specifically, the cutting tool is cut with a FIB (focused ion beam) apparatus to expose the interface layer, and while observing the cross section with a TEM, the composition of the elements constituting the interface layer, the content ratio of the first compound and the like, and the content ratio of the second compound and the like are measured. Note that, as far as the applicants performed measurements, even if the measurement results were calculated multiple times by changing the selected locations in the measurement field of view, there was almost no variation in the measurement results, and it was confirmed that the arbitrary setting of the measurement field of view did not result in arbitrary results as long as the measurements were performed on the same sample.

(Thickness)

Interface layer 5 preferably has a thickness of no less than 0.1 nm and less than 10 nm. When the thickness of the interface layer is in this range, the effect of enhancing the adhesiveness between the base body and the hard carbon film is improved. The thickness of the interface layer is more preferably no less than 0.5 nm and no more than 8 nm, and still more preferably no less than 1 nm and no more than 5 nm.

The thickness of the interface layer can be measured by observing the cross section of the hard carbon film using a SEM (scanning electron microscope). Specifically, the observation magnification for the cross section sample is set to 5,000 to 10,000 times, the observation area is set to 100 to 500 $\mu m^2$, the thickness width is measured at three arbitrarily selected locations in one field of view, and their average value is used as the "thickness". Note that, as far as the applicants performed measurements, even if the thickness measurement results were calculated multiple times by changing the selected locations in the measurement field of view, there was almost no variation in the measurement results, and it was confirmed that the arbitrary setting of the measurement field of view did not result in arbitrary results as long as the measurements were performed on the same sample.

<Other Layer>

The cutting tool of the present embodiment preferably comprises, between the interface layer and the hard carbon film, a mixed composition layer in which the compositions of these films are mixed, or a gradient composition layer in which the composition varies continuously. According to this, the adhesive force between the base body and the hard carbon film is further improved.

It is not always possible to clearly distinguish between the mixed layer and the gradient composition layer. When switching production conditions from the film formation of the interface layer to the film formation of the hard carbon film, there usually occurs a slight mixing of the compositions of the interface layer and the hard carbon film, resulting in formation of the mixed composition layer or gradient composition layer. Although it is difficult to directly confirm the above, their presence can be sufficiently inferred from the results of XPS (X-ray photo-electronic spectroscopy) or AES (Auger electron spectroscopy).

<Applications of Cutting Tool>

Since the cutting tool of the present embodiment is excellent in wear resistance and deposition resistance, it is particularly suited for processing of aluminum and alloys thereof. It is also suited for processing of non-ferrous materials such as titanium, magnesium, and copper. Furthermore, it is also suited for cutting of materials containing hard particles such as graphite, organic materials, and other materials, as well as for processing of printed circuit boards and simultaneous cutting of ferrous materials and aluminum. In addition, the hard carbon film of the cutting tool of the present embodiment has very high hardness, and therefore can be used for processing of not only non-ferrous materials, but also steels such as stainless steels, casting products, and other materials.

<Type of Cutting Tool>

The cutting tool of the present embodiment can be, for example, a drill, an end mill, a throw away tip for end milling, a throw away tip for milling, a throw away tip for turning, a metal saw, a gear cutting tool, a reamer, and a tap.

Embodiment 2: Method for Producing Cutting Tool

Figure 14:
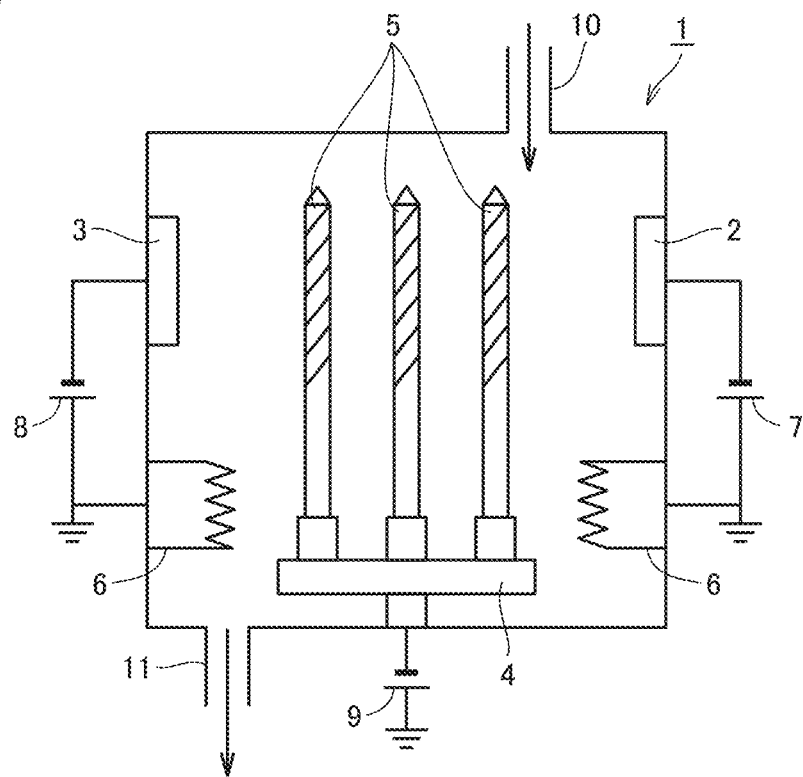
FIG. 14 is a schematic diagram showing an example of a film forming apparatus used in the production of a cutting tool according to one embodiment of the present disclosure.

The cutting tool of Embodiment 1 can be fabricated by, for example, forming a hard carbon film on a base body using a film forming apparatus 1 shown in FIG. 14. An example of the method for producing the cutting tool will be described below.

(Preparation of Base Body)

Base body 5 is prepared. The type of the base body used can be any of those described in Embodiment 1. For example, the base body is preferably composed of WC-based cemented carbide, cermet, or cubic boron nitride.

Base body 5 is mounted on a base body holder 4 in film forming apparatus 1. Base body holder 4 is rotated between targets around the central point of targets 2 and 3.

While base body 5 is heated to 200° C. using a base body heating heater 6, the degree of vacuum in film forming apparatus 1 is set to an atmosphere of $5 \times 10^{-4}$ Pa. Subsequently, the set temperature of base body heating heater 6 is lowered and the base body temperature is brought to 100° C., and then argon plasma cleaning is carried out on the surface of the base body by applying a voltage of −1000 V to base body holder 4 with a film forming bias power supply 9 while introducing argon gas and maintaining an atmosphere of $2 \times 10^{-1}$ Pa. Thereafter, the argon gas is exhausted. In film forming apparatus 1, the gas is supplied through a gas supply port 10, and the gas is discharged through an exhaust port 11.

Next, target 2 composed of a Group 4 element, Group 5 element, or Group 6 element in the Periodic Table is disposed in film forming apparatus 1.

While evaporating and ionizing target 2, a voltage of −600 V is applied to base body holder 4 with bias power supply 9 to carry out metal ion bombardment treatment. As a result, the surface of the base body is etched, improving the adhesiveness of the interface layer and hard carbon film that will be formed later.

Note that the formation of the interface layer and formation of the hard carbon film, which will be mentioned later, may be carried out without carrying out the metal ion bombardment treatment on the base body.

(Formation of Interface Layer)

Next, target 2 composed of one element selected from Group 4 elements, Group 5 elements, Group 6 elements, Group 13 elements, and Group 14 elements excluding carbon in the Periodic Table is disposed in film forming apparatus 1. Target 2 is evaporated and ionized by vacuum arc discharge while introducing or not introducing hydrocarbon gas, and a voltage of −100 V to −800 V is applied to base body holder 4 with bias power supply 9 to form the interface layer on the base body. Thereafter, the hydrocarbon gas is exhausted.

Note that the formation of the hard carbon film, which will be mentioned later, may be carried out without forming the interface layer on the base body.

(Formation of Hard Carbon Film)

Next, target 3 composed of glassy carbon is disposed in film forming apparatus 1. While introducing argon gas at a flow rate of 10 cc/min, target 3 is evaporated and ionized by vacuum arc discharge (cathode current 120 A), and a voltage of −40 V to −200 V is applied to base body holder 4 with bias power supply 9 to form the hard carbon film on the interface layer, thereby obtaining the cutting tool.

As the glassy carbon, those commercially available can be used. Glassy carbon is a highly pure carbonaceous material and is free from contamination by metallic elements compared to sintered carbon (such as sintered graphite) used in conventional cathodes. In particular, glassy carbon manufactured by Hitachi Chemical Co., Ltd. does not contain aluminum (Al) and is therefore particularly suitable for cutting of aluminum alloys. Also, when glassy carbon is used, generation of macroparticles in the hard carbon film can be suppressed and a smooth hard carbon film can be obtained, improving cutting performance.

Figure 15:
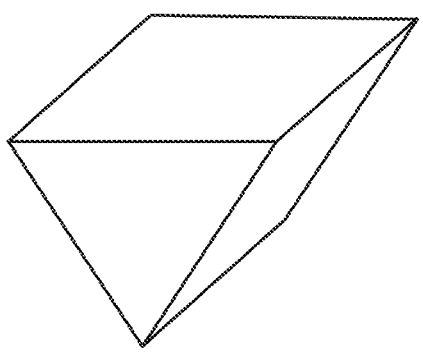
FIG. 15 shows an example of a target used in the production of a cutting tool according to one embodiment of the present disclosure.

The shape of the target used is generally cylindrical, disk-shaped, or rectangular. However, as a result of diligent investigations, the present inventors have newly found that a triangular prism shape, as shown in FIG. 15, is suitable from the viewpoint of improving the film quality of the hard carbon film. To the target, a high current needs to be applied, and the use of a V-shaped electrode and adhesion between the side of the target and the electrode enables a stable power supply to the target. Furthermore, because the target and the electrode adhere to each other, the cooling effect can also be enhanced. Efficient cooling of the target lowers electrical resistance and facilitates arc spot migration. As a result, occurrence of defects in the hard carbon film is suppressed and the film quality of the hard carbon film is improved.

From the viewpoint of improving the purity of the hard carbon film, film formation in a vacuum without introducing Ar gas is preferred. However, as a result of diligent investigations, the present inventors have newly found that arc discharge is more stable and film quality is improved when Ar gas is supplied at a flow rate of 10 cc/min rather than in a vacuum.

EXAMPLES

The present embodiments will be described even further specifically by way of Examples. However, the present embodiments shall not be limited by these Examples.

Example 1

[Fabrication of Cutting Tool]
<<Sample 1 to Sample 3, and Sample 7>>

In Sample 1 to Sample 3, and Sample 7, cutting tools were fabricated by using glassy carbon as a raw material and forming the interface layer and the hard carbon film on the base body in this order using the cathodic arc ion plating method (referred to as "Arc method" in Table 1).

<Sample 1>
(Preparation of Base Body)

A φ6 mm drill made of WC (particle size: 1 μm) based cemented carbide was prepared as the base body. This base body contains 8% by mass of Co as the binder.

The base body was mounted inside film forming apparatus 1 shown in FIG. 14, and while heating the base body to 200° C. using base body heating heater 6, the degree of vacuum in film forming apparatus 1 was set to an atmosphere of $5 \times 10^{-4}$ Pa. Subsequently, the set temperature of base body heating heater 6 was lowered and the base body temperature was brought to 100° C., and then argon plasma cleaning was carried out on the surface of the base body by applying a voltage of −1000 V to base body holder 4 with film forming bias power supply 9 while introducing argon gas and maintaining an atmosphere of $2 \times 10^{-1}$ Pa. Thereafter, the argon gas was exhausted.

(Formation of Interface Layer)

Next, while introducing hydrocarbon gas into film forming apparatus 1 at a flow rate of 10 cc/min, a triangular prism-shaped target made of chromium (Cr) was evaporated and ionized by vacuum arc discharge (cathode current 80 A), and a voltage of −800 V was applied to base body holder 4 with bias power supply 9 to form the interface layer composed of chromium carbide (CrC) with a thickness of 5 nm on the base body. Thereafter, the hydrocarbon gas was exhausted.

(Formation of Hard Carbon Film)

Next, while introducing argon gas into film forming apparatus 1 at a flow rate of 10 cc/min, a triangular prism-shaped target made of glassy carbon ("Glass-like Carbon" manufactured by Hitachi Chemical Co., Ltd.) was evaporated and ionized by vacuum arc discharge (cathode current 120 A), and a voltage of −200 V was applied to base body holder 4 with bias power supply 9 to form the hard carbon film with a thickness of 0.6 μm on the interface layer, thereby obtaining the cutting tool.

<Sample 2>

(Preparation of Base Body)

The base body was prepared by the same method as in Sample 1.

(Formation of Interface Layer)

Next, without introducing gas into film forming apparatus 1, a target made of chromium (Cr) was evaporated and ionized by vacuum arc discharge (cathode current 80 A), and a voltage of −800 V was applied to base body holder 4 with bias power supply 9 to form the interface layer composed of chromium (Cr) with a thickness of 5 nm on the base body. Thereafter, the hydrocarbon gas was exhausted.

(Formation of Hard Carbon Film)

Next, while introducing argon gas into film forming apparatus 1 at a flow rate of 10 cc/min, a triangular prism-shaped target made of glassy carbon ("Glass-like Carbon" manufactured by Hitachi Chemical Co., Ltd.) was evaporated and ionized by vacuum arc discharge (cathode current 120 A), and a voltage of −150 V was applied to base body holder 4 with bias power supply 9 to form the hard carbon film with a thickness of 0.4 μm on the interface layer, thereby obtaining the cutting tool.

<Sample 3>

(Preparation of Base Body)

The base body was prepared by the same method as in Sample 1.

(Formation of Interface Layer)

Next, while introducing hydrocarbon gas into film forming apparatus 1 at a flow rate of 10 cc/min, a triangular prism-shaped target made of titanium (Ti) was evaporated and ionized by vacuum arc discharge (cathode current 80 A), and a voltage of −100 V was applied to base body holder 4 with bias power supply 9 to form the interface layer composed of titanium carbide (TiC) with a thickness of 5 nm on the base body. Thereafter, the hydrocarbon gas was exhausted.

(Formation of Hard Carbon Film)

Next, while introducing argon gas into film forming apparatus 1 at a flow rate of 10 cc/min, a triangular prism-shaped target made of glassy carbon ("Glass-like Carbon" manufactured by Hitachi Chemical Co., Ltd.) was evaporated and ionized by vacuum arc discharge (cathode current 120 A), and a voltage of −100 V was applied to base body holder 4 with bias power supply 9 to form the hard carbon film with a thickness of 0.6 μm on the interface layer, thereby obtaining the cutting tool.

<Sample 7>

(Preparation of Base Body)

The base body was prepared by the same method as in Sample 1.

(Formation of Interface Layer)

Next, without introducing gas into film forming apparatus 1, a target made of titanium (Ti) was evaporated and ionized by vacuum arc discharge (cathode current 80 A), and a voltage of −800 V was applied to base body holder 4 with bias power supply 9 to form the interface layer composed of titanium (Ti) with a thickness of 5 nm on the base body. Thereafter, the hydrocarbon gas was exhausted.

(Formation of Hard Carbon Film)

Next, while introducing argon gas into film forming apparatus 1 at a flow rate of 10 cc/min, a triangular prism-shaped target made of glassy carbon ("Glass-like Carbon" manufactured by Hitachi Chemical Co., Ltd.) was evaporated and ionized by vacuum arc discharge (cathode current 120 A), and a voltage of −40 V was applied to base body holder 4 with bias power supply 9 to form the hard carbon film with a thickness of 0.6 μm on the interface layer, thereby obtaining the cutting tool.

<<Sample 4 to Sample 6, and Sample 8>>

In Sample 4 to Sample 6, and Sample 8, cutting tools were fabricated by using glassy carbon as a raw material and forming the hard carbon film on the base body using the cathodic arc ion plating method.

<Sample 4 to Sample 6, and Sample 8>

(Preparation of Base Body)

The base body was prepared by the same method as in Sample 1.

(Formation of Hard Carbon Film)

Next, while introducing argon gas into film forming apparatus 1 at a flow rate of 10 cc/min, a triangular prism-shaped target made of glassy carbon ("Glass-like Carbon" manufactured by Hitachi Chemical Co., Ltd.) was evaporated and ionized by vacuum arc discharge (cathode current 120 A), and a voltage shown in the "Bias voltage (V)" column of Table 1 was applied to base body holder 4 with bias power supply 9 to form the hard carbon film on the base body, thereby obtaining the cutting tool. The thickness of the hard carbon film for each sample is as shown in the "Thickness (μm)" column under "Hard carbon film" in Table 1.

<Sample 9>

In Sample 9, a cutting tool was fabricated by using sintered graphite as a raw material and forming the hard carbon film on the base body using the cathodic arc ion plating method.

(Preparation of Base Body)

The base body was prepared by the same method as in Sample 1.

(Formation of Hard Carbon Film)

Next, while introducing argon gas into film forming apparatus 1 at a flow rate of 10 cc/min, a triangular prism-shaped target made of sintered graphite ("IG-510" manufactured by Toyo Tanso Co., Ltd.) was evaporated and ionized by vacuum arc discharge (cathode current 120 A), and a voltage of −100 V was applied to base body holder 4 with bias power supply 9 to form the hard carbon film with a thickness of 0.6 μm on the base body, thereby obtaining the cutting tool. Note that droplets were observed on the surface of this sample.

<<Sample 10>>

Sample 10 was prepared by fabricating a cutting tool by the same production method as for Sample 9, and by polishing the surface of the hard carbon film using an elastic abrasive impregnated with diamond abrasive grains to remove droplets on the surface.

<<Sample 11>>

In Sample 11, a cutting tool was fabricated by forming the hard carbon film with a thickness of 0.6 μm on the same base body as Sample 1, using a plasma CVD method with methane gas as the raw material.

[Evaluation]

(X-Ray Diffraction Measurement)

X-ray diffraction measurement was carried out on the hard carbon film for each sample. The obtained X-ray diffraction spectrum was separated into the peaks derived from the graphite phase and the spectrum derived from the amorphous phase by peak separation by the method described in the above Embodiment 1.

In Sample 1 to Sample 10, the peaks derived from the graphite phase and the spectrum derived from the amorphous phase were observed. This indicates that the hard carbon films of Sample 1 to Sample 10 include both graphite phase and amorphous phase.

In Sample 11, only the spectrum derived from the amorphous phase was observed, and no peaks derived from the graphite phase were observed. This indicates that the graphite phase is not present in the hard carbon film of Sample 11.

(Measurement of Hydrogen Content)

The hydrogen content was measured for the hard carbon film of each sample. The method for measuring the hydrogen content is described in Embodiment 1, and thus the description therefor will not be repeated. The results are shown in the "Hydrogen content (atom %)" column of Table 1.

(Measurement of Hardness)

The hardness was measured for the hard carbon film of each sample. The method for measuring the hardness is described in Embodiment 1, and thus the description therefor will not be repeated. The results are shown in the "Hardness (GPa)" column of Table 1.

(Measurement of Density)

The density was measured for the hard carbon film of each sample. The method for measuring the density is described in Embodiment 1, and thus the description therefor will not be repeated. The results are shown in the "Density (g/cm$^3$)" column of Table 1.

(Measurement of Degree of Crystallinity)

The degree of crystallinity was measured for the hard carbon film of each sample. The method for measuring the degree of crystallinity is described in Embodiment 1, and thus the description therefor will not be repeated. The results are shown in the "Degree of crystallinity (%)" column of Table 1.

(Measurement of Average Coordination Number)

The average coordination number of the amorphous phase was measured for the hard carbon film of each sample. The method for measuring the average coordination number is described in Embodiment 1, and thus the description therefor will not be repeated. The results are shown in the "Coordination number (coordination)" column of Table 1.

(Cutting Test)

Using the cutting tool of each sample, drilling was carried out under the following cutting conditions.

Work material: ADC12 (Al—Si—Cu alloy)
Cutting speed: 200 m/min
Feed speed: 0.4 mm/rev
Hole depth: 23 mm stop
Coolant: internal oil supply 1.9 MPa The number of holes drilled until the tip of the drill was worn out, the adherence of the aluminum alloy occurred, and then defects (no less than 500 μm) occurred was measured. The larger the number of drilled holes, the better the wear resistance and the longer the tool life. The results are shown in the "Number of drilled holes" column under "Cutting test" in Table 1.

TABLE 1

| Sample No. | Film formation method | Target | Film formation conditions of hard carbon film | | | Inter-face layer Type Thickness | Hard carbon film | |
|---|---|---|---|---|---|---|---|---|
| | | | Argon gas flow rate (cc/min) | Cathode current (A) | Bias voltage (V) | | Thickness (μm) | Peaks derived from graphite phase |
| 1 | Arc method | Glassy carbon | 10 | 120 | −200 | CrC: 5 nm | 0.6 | Present |
| 2 | Arc method | Glassy carbon | 10 | 120 | −150 | Cr: 5 nm | 0.4 | Present |
| 3 | Arc method | Glassy carbon | 10 | 120 | −100 | TiC 5 nm | 0.6 | Present |
| 4 | Arc method | Glassy carbon | 10 | 120 | −100 | Absent | 0.6 | Present |
| 5 | Arc method | Glassy carbon | 10 | 120 | −80 | Absent | 1.5 | Present |
| 6 | Arc method | Glassy carbon | 10 | 120 | −60 | Absent | 2.5 | Present |
| 7 | Arc method | Glassy carbon | 10 | 120 | −40 | Ti 5 nm | 0.6 | Present |
| 8 | Arc method | Glassy carbon | 10 | 120 | −10 | Absent | 0.6 | Present |
| 9 | Arc method | Sintered graphite | 10 | 120 | −100 | Absent | 0.6 | Present |
| 10 | Arc method | Sintered graphite | 10 | 120 | −100 | Absent | 0.6 | Present |
| 11 | CVD method | (Methane gas) | — | — | — | Absent | 0.6 | Absent |

TABLE 1-continued

| Sample No. | Hard carbon film | | | | | | | Cutting test Number of drilled holes |
|---|---|---|---|---|---|---|---|---|
| | Hydrogen content (atom %) | Hardness (GPa) | Density (g/cm³) | Coordination number (coordination) | Degree of crystallinity (%) | Droplets | Surface polishing | |
| 1 | 1 | 49 | 2.6 | 2.7 | 5.9 | Absent | Not performed | 4200 |
| 2 | 1 | 53 | 2.8 | 3.4 | 5.7 | Absent | Not performed | 4600 |
| 3 | 0.5 | 59 | 3.2 | 3.7 | 4.9 | Absent | Not performed | 6500 |
| 4 | 0.5 | 59 | 3.2 | 3.7 | 4.9 | Absent | Not performed | 4800 |
| 5 | 0.5 | 63 | 3.2 | 3.7 | 4.9 | Absent | Not performed | 5000 |
| 6 | 0.5 | 69 | 3.2 | 3.7 | 4.9 | Absent | Not performed | 6000 |
| 7 | 0.3 | 71 | 3.4 | 3.8 | 3.2 | Absent | Not performed | 8000 |
| 8 | 0.5 | 42 | 2.4 | 2.6 | 12.3 | Absent | Not performed | 2500 |
| 9 | 1.5 | 55 | 3.2 | 3.3 | 8.0 | Present | Not performed | 2 |
| 10 | 1.5 | 55 | 3.2 | 3.3 | 8.0 | Present | Performed | 2000 |
| 11 | 25 | 18 | 2.0 | 2.1 | — | Absent | Not performed | 150 |

<Discussion>

The cutting tools of Sample 1 to Sample 7 correspond to Examples. The cutting tools of Sample 8 to Sample 11 correspond to Comparative Examples.

It was confirmed that Sample 1 to Sample 7 (Examples) had a larger number of drilled holes, superior wear resistance, and a longer tool life compared to Sample 8 to Sample 11 (Comparative Examples).

Sample 8 has a hard carbon film with a density of less than 2.5 g/cm³ and a degree of crystallinity of greater than 6.5%, and thus is considered to have a low hardness, decreased wear resistance, and a short tool life.

Sample 9 and Sample 10 have a hard carbon film with a degree of crystallinity of greater than 6.5%, and thus are considered to have a low hardness, decreased wear resistance, and a short tool life.

Sample 11 has a hard carbon film that does not include the graphite phase, and is considered to have a low hardness, decreased wear resistance, and a short tool life.

Example 2

<<Sample 2-1>>
(Preparation of Base Body)

An insert made of cermet with a chip model number of DCGT11T308 was prepared as the base body. Argon plasma cleaning was carried out on the base body surface in the same manner as for Sample 1.
(Formation of Hard Carbon Film)

Next, the hard carbon film with a thickness of 0.6 μm was formed on the base body by film formation under the same conditions as for Sample 1, thereby obtaining a cutting tool.
<<Sample 2-2>>

Sample 2-2 is the same insert as the one prepared for Sample 2-1. Sample 2-2 has no hard carbon film.
[Evaluation]
(X-Ray Diffraction Measurement)

X-ray diffraction measurement was carried out on the hard carbon film for Sample 2-1. The obtained X-ray diffraction spectrum was separated into the peaks derived from the graphite phase and the spectrum derived from the amorphous phase by peak separation by the method described in the above Embodiment 1.

In Sample 2-1, the peaks derived from the graphite phase and the spectrum derived from the amorphous phase were observed. This indicates that the hard carbon film of Sample 2-1 includes both graphite phase and amorphous phase.
(Measurement of Hydrogen Content, Measurement of Hardness, Measurement of Density, Measurement of Degree of Crystallinity, and Measurement of Average Coordination Number)

For the hard carbon film of Sample 2-1, measurement of the hydrogen content, measurement of the hardness, measurement of the density, measurement of the degree of crystallinity, and measurement of the average coordination number of the amorphous phase were carried out. Each measurement method is described in Embodiment 1, and thus the description therefor will not be repeated. The results are shown in the "Hydrogen content (atom %)", "Hardness (GPa)", "Density (g/cm³)", "Degree of Crystallinity (%)", and "Coordination number (coordination)" columns of Table 2.

(Cutting Test)

Using the cutting tool of each sample, round bar turning was carried out under the following cutting conditions.

Work material: ADC12 (Al—Si—Cu alloy) round bar

Cutting speed: 300 m/min

Feed speed: 0.2 mm/rev

Cut depth: 1.0 mm

Cutting oil: 0.4 MPa

The cutting length (km) was measured until defects (no less than 500 μm) occurred in the tool due to cutting edge adherence. The longer the cutting length, the better the defect resistance and the longer the tool life. The results are shown in the "Cutting length" column under "Cutting test" in Table 2.

TABLE 2

| Sample No. | Presence/ absence of film | Hard carbon film | | | | | | | | | Cutting test Cutting length |
|---|---|---|---|---|---|---|---|---|---|---|---|
| | | Film formation method | Target | Thickness (μm) | Peaks derived from graphite phase | Hydrogen content (atom %) | Hardness (GPa) | Density (g/cm$^3$) | Coordination number (coordination) | Degree of crystallinity (%) | |
| 2-1 | Present | Arc method | Glassy carbon | 0.6 | Present | 0.9 | 50 | 2.7 | 2.8 | 5.9 | 4 km |
| 2-2 | Absent | — | — | — | — | — | — | — | — | — | 10 m |

<Discussion>

The cutting tool of Sample 2-1 corresponds to Example. The cutting tool of Sample 2-2 corresponds to Comparative Example. It was confirmed that Sample 2-1 (Example) had a longer cutting length, superior defect resistance, and a longer tool life compared to Sample 2-2 (Comparative Example).

Example 3

<<Sample 3-1>>
(Preparation of Base Body)

An insert made of cubic boron nitride with a chip model number of VBGW160408 was prepared as the base body. Argon plasma cleaning was carried out on the base body surface in the same manner as for Sample 1.
(Formation of Hard Carbon Film)

Next, the hard carbon film with a thickness of 0.6 μm was formed on the base body by film formation under the same conditions as for Sample 1, thereby obtaining a cutting tool.
<<Sample 3-2>>

Sample 3-2 is the same insert as the one prepared for Sample 3-1. Sample 3-2 has no hard carbon film.
[Evaluation]
(X-Ray Diffraction Measurement)

X-ray diffraction measurement was carried out on the hard carbon film for Sample 3-1. The obtained X-ray diffraction spectrum was separated into the peaks derived from the graphite phase and the spectrum derived from the amorphous phase by peak separation by the method described in the above Embodiment 1.

In Sample 3-1, the peaks derived from the graphite phase and the spectrum derived from the amorphous phase were observed. This indicates that the hard carbon film of Sample 3-1 includes both graphite phase and amorphous phase.
(Measurement of Hydrogen Content, Measurement of Hardness, Measurement of Density, Measurement of Degree of Crystallinity, and Measurement of Average Coordination Number)

For the hard carbon film of Sample 3-1, measurement of the hydrogen content, measurement of the hardness, measurement of the density, measurement of the degree of crystallinity, and measurement of the average coordination number of the amorphous phase were carried out. Each measurement method is described in Embodiment 1, and thus the description therefor will not be repeated. The results are shown in the "Hydrogen content (atom %)", "Hardness (GPa)", "Density (g/cm$^3$)", "Degree of Crystallinity (%)", and "Coordination number (coordination)" columns of Table 3.
(Cutting Test)

Using the cutting tool of each sample, round bar turning was carried out under the following cutting conditions.

Work material: ADC12 (Al—Si—Cu alloy) round bar

Cutting speed: 500 m/min

Feed speed: 0.15 mm/rev

Cut depth: 0.5 mm

Cutting oil: external oil supply 0.4 MPa

The cutting length (km) was measured until defects (no less than 500 μm) occurred in the tool due to cutting edge adherence. The longer the cutting length, the better the defect resistance and the longer the tool life. The results are shown in the "Cutting length" column under "Cutting test" in Table 3.

TABLE 3

| Sample No. | Presence/ absence of film | Hard carbon film | | | | | | | | | Cutting test Cutting length |
|---|---|---|---|---|---|---|---|---|---|---|---|
| | | Film formation method | Target | Thickness (μm) | Peaks derived from graphite phase | Hydrogen content (atom %) | Hardness (GPa) | Density (g/cm$^3$) | Coordination number (coordination) | Degree of crystallinity (%) | |
| 3-1 | Present | Arc method | Glassy carbon | 0.6 | Present | 1.1 | 48 | 2.6 | 2.6 | 5.9 | 10 km |
| 3-2 | Absent | — | — | — | — | — | — | — | — | — | 5 m |

<Discussion>

The cutting tool of Sample 3-1 corresponds to Example. The cutting tool of Sample 3-2 corresponds to Comparative Example. It was confirmed that Sample 3-1 (Example) had a longer cutting length, superior defect resistance, and a longer tool life compared to Sample 3-2 (Comparative Example).

While the above description of the embodiments and Examples of the present disclosure has been given, it has been planned from the outset to combine the configuration of each of the above-mentioned embodiments and Examples as appropriate, or to modify them in various ways.

The embodiments and Examples disclosed here should be considered merely illustrative and not restrictive in all respects. The scope of the present invention is presented by the claims rather than the embodiments and Examples given above, and it is intended that all modifications within the meaning and scope equivalent to the claims be included.

REFERENCE SIGNS LIST

1 film forming apparatus; 2, 3 target; 4 base body holder; 5 base body; 6 base body heating heater; 7, 8 power supply; 9 film forming bias power supply; 10 gas supply port; 11 exhaust port; 20 hard carbon film; 21 interface layer; 24 graphite phase; 25 amorphous phase; 30, 31 cutting tool; S1 spectrum of extracted pattern; S21 normalized spectrum; S4 spectrum derived from amorphous phase; A11, A12, A13, A21, A22, A23 peak derived from graphite phase; L1 straight line; L2, L12, L22 perpendicular line; a1, a3, b1, b3, c1, c3 approximate straight line; a2, b2, c2 intersection point; P1 measured peak

The invention claimed is:

1. A cutting tool comprising a base body and a hard carbon film arranged on the base body, wherein
the hard carbon film includes an amorphous phase and a graphite phase,
a density of the hard carbon film is no less than 2.5 g/cm$^3$ and no more than 3.5 g/cm$^3$,
a degree of crystallinity of the hard carbon film is no more than 6.5%, and
an average coordination number of the amorphous phase is no less than 2.5 and no more than 4.

2. The cutting tool according to claim 1, wherein the hard carbon film has a thickness of no less than 0.1 μm and no more than 3 μm at a portion involved in cutting.

3. The cutting tool according to claim 1, wherein the hard carbon film has a hydrogen content of no more than 5 atom %.

4. The cutting tool according to claim 1, wherein the base body and the hard carbon film are in contact with each other.

5. The cutting tool according to claim 1, comprising an interface layer disposed between the base body and the hard carbon film,
wherein the interface layer contains:
at least one selected from the group consisting of a material made of a single element selected from a first group consisting of Group 4 elements, Group 5 elements, Group 6 elements, Group 13 elements, and Group 14 elements excluding carbon in the Periodic Table, an alloy or first compound containing at least one element selected from the first group, and a solid solution derived from the first compound; or
one or both of a second compound composed of at least one element selected from the first group and carbon, and a solid solution derived from the second compound, and
the interface layer has a thickness of no less than 0.5 nm and less than 10 nm.

6. The cutting tool according to claim 1, wherein the base body is composed of WC-based cemented carbide or cermet.

7. The cutting tool according to claim 1, wherein the base body is composed of cubic boron nitride.

8. The cutting tool according to claim 1, wherein the density of the hard carbon film is no less than 3.0 g/cm$^3$ and no more than 3.5 g/cm$^3$.

9. The cutting tool according to claim 1, wherein the density of the hard carbon film is no less than 3.2 g/cm$^3$ and no more than 3.4 g/cm$^3$.

10. The cutting tool according to claim 1, wherein the degree of crystallinity of the hard carbon film is no less than 2% and no more than 6.5%.

11. The cutting tool according to claim 1, wherein the degree of crystallinity of the hard carbon film is no less than 3% and no more than 5%.

12. The cutting tool according to claim 1, wherein the average coordination number of the amorphous phase is no less than 3.5 and no more than 4.

13. The cutting tool according to claim 1, wherein the hard carbon film has a thickness of no less than 0.5 μm and no more than 3 μm at a portion involved in cutting.

14. The cutting tool according to claim 1, wherein the hard carbon film consists of the amorphous phase and the graphite phase.

15. The cutting tool according to claim 1, wherein the hard carbon film has a hydrogen content of no less than 0 atom % and no more than 5 atom %.

* * * * *